United States Patent [19]

Fetty

[11] Patent Number: 5,132,772
[45] Date of Patent: Jul. 21, 1992

[54] SEMICONDUCTOR DEVICE HAVING TAPE AUTOMATED BONDING (TAB) LEADS WHICH FACILITATE LEAD BONDING

[75] Inventor: Allan M. Fetty, Manchaca, Tex.

[73] Assignee: Motorola, Inc., Schaumburg, Ill.

[21] Appl. No.: 708,644

[22] Filed: May 31, 1991

[51] Int. Cl.⁵ .................... H01L 23/54; H01L 23/48
[52] U.S. Cl. ........................................ 357/68; 357/69
[58] Field of Search .................. 357/80, 68, 70, 69

[56] References Cited

U.S. PATENT DOCUMENTS

| | | | |
|---|---|---|---|
| 3,519,896 | 7/1970 | Kelley | 357/68 |
| 3,680,206 | 8/1972 | Roberts | 357/70 |
| 4,862,246 | 8/1989 | Masuda et al. | 357/70 |

Primary Examiner—Rolf Hille
Assistant Examiner—S. V. Clark
Attorney, Agent, or Firm—Patricia S. Goddard

[57] ABSTRACT

A semiconductor device (20) has a plurality of TAB leads (28) which facilitate lead bonding. The device is comprised of a semiconductor die (22) having a plurality of bonding pads (24) located thereon. On each of the bonding pads is a bump (26). Bonded to each of the bumps is a TAB lead (28) which has a recessed portion, such as a hole (30). The recessed portion or hole is placed over a protrusion of the bump, for example a tail of a ball bump, such that the lead is guided into the appropriate position relative to the bump during lead bonding, thereby preventing misalignment. The presence of the recessed portion in the lead also eliminates the need to flatten bumps prior to lead bonding.

8 Claims, 4 Drawing Sheets

SEMICONDUCTOR DEVICE HAVING TAPE AUTOMATED BONDING (TAB) LEADS WHICH FACILITATE LEAD BONDING

FIELD OF THE INVENTION

The present invention relates to semiconductor devices in general and more specifically to semiconductor devices having TAB leads and methods for making the same.

BACKGROUND OF THE INVENTION

Demand is driving semiconductor manufacturers to make the overall size of semiconductor devices smaller and smaller. One method of reducing device size is to assemble a device in a protective body or package which utilizes tape automated bonding (TAB) leads. TAB leads are formed from a very thin conductor which is laminated to a film carrier rather than from a stamped or etched metal frame used to form other conventional leads. For this reason, TAB leads can be made much smaller, resulting in smaller semiconductor devices. Usually, TAB leads are formed of a copper laminated layer on one or both sides of the carrier film. Copper is laminated on the film in order to provide conductive paths or traces to form leads. The copper leads are often plated with gold for better adhesion as will be evident below.

In a semiconductor device, TAB leads are bonded to a set of bonding pads formed on a semiconductor die in order to provide electrical connection to various circuits on the die. The fragile nature of TAB leads and clearance requirements needed to make reliable bonds prohibit TAB leads from being directly bonded to most bonding pads. In order to have suitable TAB lead bonding, an intermediate bonding feature, commonly referred to as a bump, is usually formed on each of the bonding pads.

Bumps are most often comprises of gold to enhance lead adhesion and are formed on bonding pads of a semiconductor die by one of several ways. One bumping technique is plating. In the bump plating process, an entire surface of the die having the bonding pads located thereon is initially coated with a thin layer of sputter deposited gold. A mask, for example photoresist, is formed on the thin gold layer and is patterned to expose the sputtered gold layer overlying the bonding pads of the die. The exposed portions of the sputtered gold layer are then plated with gold, usually by electrodeposition, to increase the gold thickness over the bonding pad area, thereby forming a plurality of gold bumps on the die surface. After forming the bumps, the mask is removed and a quick chemical etch is used to remove the sputter deposited gold layer on the non-bumped portions of the die surface. The sputter deposited gold layer is used only to provide a surface which can be readily gold plated and is therefore removed after the bumps are formed to prevent the bumps from being short-circuited to one another.

While gold plated bumps establish reliable bonds to TAB leads, the use of gold plated bumps has several disadvantages. A significant disadvantage is the prohibitive cost associated with the plating process. Plating requires all die on a given wafer to be bumped, regardless of whether or not the die is functional. For example, on a wafer which yields 85 percent functional or "good" die, 15 percent of the die will be bumped unnecessarily, thereby adding cost to the functional die. Furthermore, plating requires a series of steps including sputtering, masking, plating, and etching, each of which increases fabrication costs. Yet another disadvantage with plated bumps is that the series of fabrication steps increases fabrication time which in turn also increases cost.

Another bumping technique which overcomes many of the above disadvantages is ball bumping. Ball bumping referes to a process which utilizes a conventional wire bonding tool to form bumps on bonding pads of a semiconductor die. Semiconductor devices which do not employ TAB leads often have metal leads which are coupled to bonding pads by a very fine gold wire. One end of the wire is attached to the bonding pad while another end is attached to a tip of the lead which is usually spaced apart from the die. In the ball bumping technique, the fine gold wire is modified so that the wire does not span from the die to a lead. Instead, the wire is bonded to the bonding pad and then cut or severed. In bonding the wire to the bonding pad, the wire is compressed into a ball shape, thus the term "ball bump". FIG. 1A illustrates an example of a known semiconductor device 10 which utilizes ball bumps. The device includes a semiconductor die 12 having a plurality of bonding pads 14 located on one of the die surfaces. A ball bump 16, formed from a fine gold wire, is bonded to each of the plurality of bonding pads. Ball bumps 16 are bonded to the bonding pads by compressing the wire against the bonding pads and then severing the wire to form the bump. Upon bonding the wire, a rounded base portion 17 of the bump is formed as a result of compressing the wire against the die surface. A tail portion 19 above base portion 17 is also formed as the wire is drawn away from the die surface during the bonding procedure. At a predetermined distance from the die, the wire is broken to complete the ball bump. As a cross-sectional view in FIG. 1B illustrates, it is difficult to bond a lead 13 to a ball bump 16 due to the shape of the bump. Upon bonding lead 13 to the bump, tail portion 17 deflects the lead, for example as indicated by either of dashed leads 13' and 13", causing substantial lead misalignment.

Therefore, to suitably bond TAB leads to device 10 illustrated in FIG. 1A, the tail portions 17 of the ball bumps must be removed or flattened. One of the most common ways of flattening the ball bumps is by a process known as "coining". By pressing a flat surface, for example a metal plate (not shown), against the die surface, ball bumps 16 are flattened as illustrated in FIG. 2A. Although the flattened upper surface of ball bumps 16 establishes a suitable surface on which to bond TAB leads, coining has disadvantages. One disadvantage is that coining is a mechanical operation which can crack or otherwise damage the semiconductor die if not properly controlled. Furthermore, coining is an additional step in the semiconductor fabrication process which leads to an increase in manufacturing cost and ultimately an increase in device cost. Nor does coining eliminate potential misalignment problems. Bumps are arranged on the semiconductor die in a designated pattern corresponding to the bond pad locations. TAB leads which are to be bonded to these bumps are arranged in an identical pattern so that the leads will match up with the bumps during the lead bonding operation. As FIG. 2B illustrates, the slightest misplacement of bump 16 or of lead 13, as shown by a dashed lead 13''', may result in offset bonding of the leads or missed bonds altogether, thereby creating a potential for short-circuits to adjacent leads and/or open circuits. Misalignment problems may also arise if the bonding surface of the bumps is not completely level and horizontal with the die surface such that the lead slips off the bump during bonding. These misalignment problems, such as that illustrated in FIG. 2B, are not only associated with ball bumping techniques, but also with the previously described plated bumping technique.

Therefore, a need exists for an improved semiconductor device, and more specifically for a semiconductor device having TAB leads and a method for making the same which reduces fabrication costs and manufacturing time and which provides a self-aligned TAB lead to substantially reduce lead bonding misalignment.

SUMMARY OF THE INVENTION

The previously discussed shortcomings of existing semiconductor devices are overcome and additional advantages are achieved with the present invention. One embodiment of the present invention is a semiconductor device having tape automated bonding (TAB) leads which facilitate lead bonding. The device comprises a semiconductor die having a plurality of bonding pads and a plurality of bumps, each bump being formed on one of each of the plurality of bonding pads. The device also has a plurality of leads, each lead being bonded to a respective one of the plurality of bumps and having a recessed portion which accommodates a portion of the respective one of the plurality of bumps in order to facilitate lead bonding.

These and other features, and advantages, will be more clearly understood from the following detailed description taken in conjunction with the accompanying drawings.

DETAILED DESCRIPTION OF A PREFERRED EMBODIMENT

Because tape automated bonding (TAB) is becoming an increasingly popular approach to building semiconductor devices, there is a need for improved TAB processes. Existing processes are costly and require several processing steps. In addition, these processes depend heavily on proper alignment. The present invention eases alignment requirements because leads of a semiconductor device in accordance with the invention have features to direct the lead into the appropriate position during lead bonding. Furthermore, the lead feature eliminates the need to coin ball bumps in a TAB process, thereby reducing manufacturing time and cost. The invention may also be implemented in devices which employ plated bumps; however, the benefit in using the present invention with plated bumps is primarily ease of alignment since the number of processing steps is not reduced.

Figure 1A:
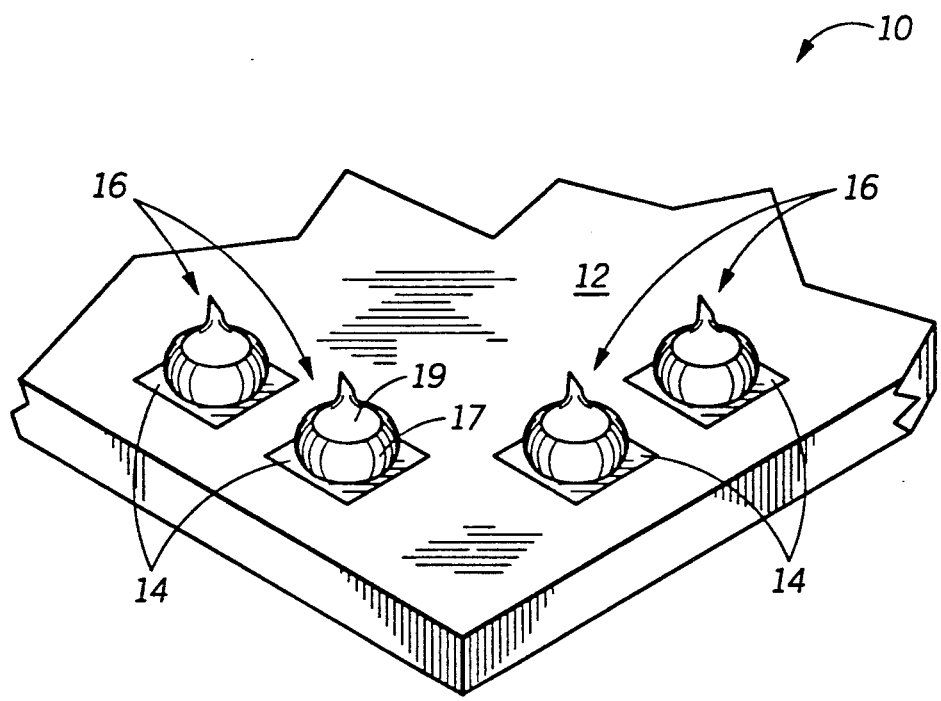
FIG. 1A is a perspective illustration of a portion of a conventional semiconductor device which utilizes ball bumps.
Figure 1B:
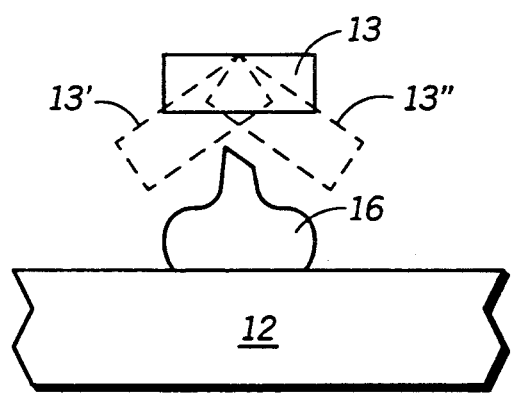
FIG. 1B is a cross-sectional illustration of a lead bonding problem associated with the semiconductor device of FIG. 1A.
Figure 2A:
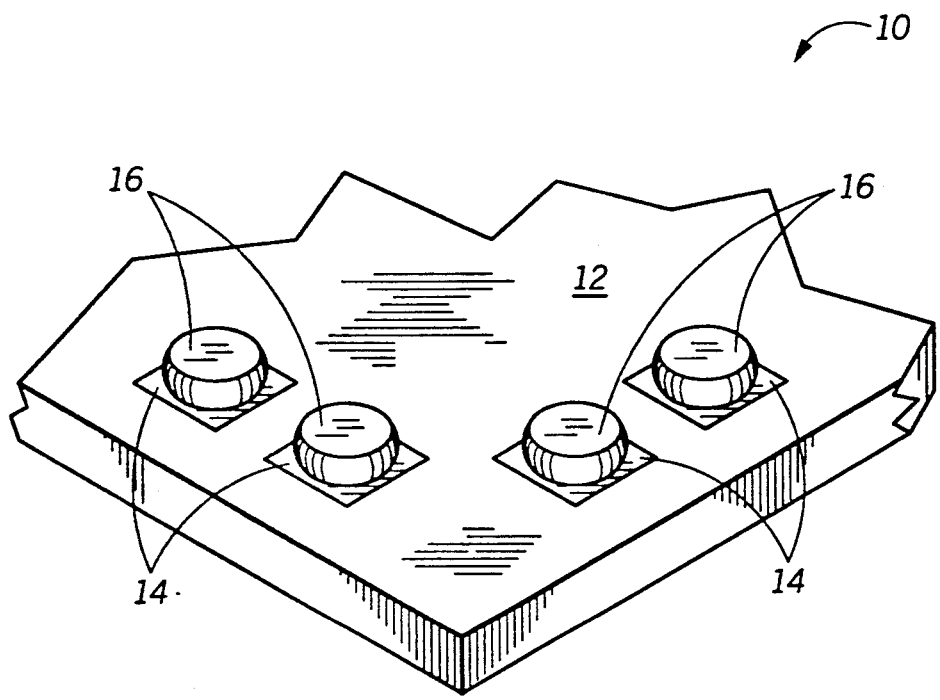
FIG. 2A is a perspective illustration of the conventional semiconductor device of FIG. 1 after the ball bumps have been coined.
Figure 2B:
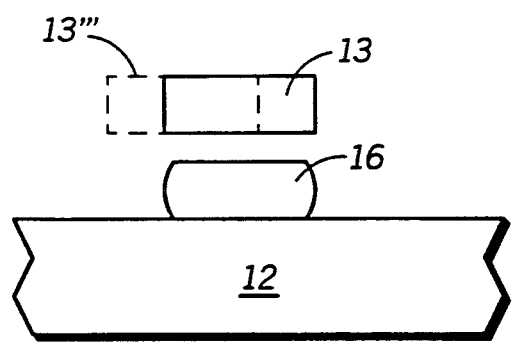
FIG. 2B is a cross-sectional illustration of lead misalignment which may occur during lead bonding to the semiconductor device of FIG. 2A.
Figure 3:
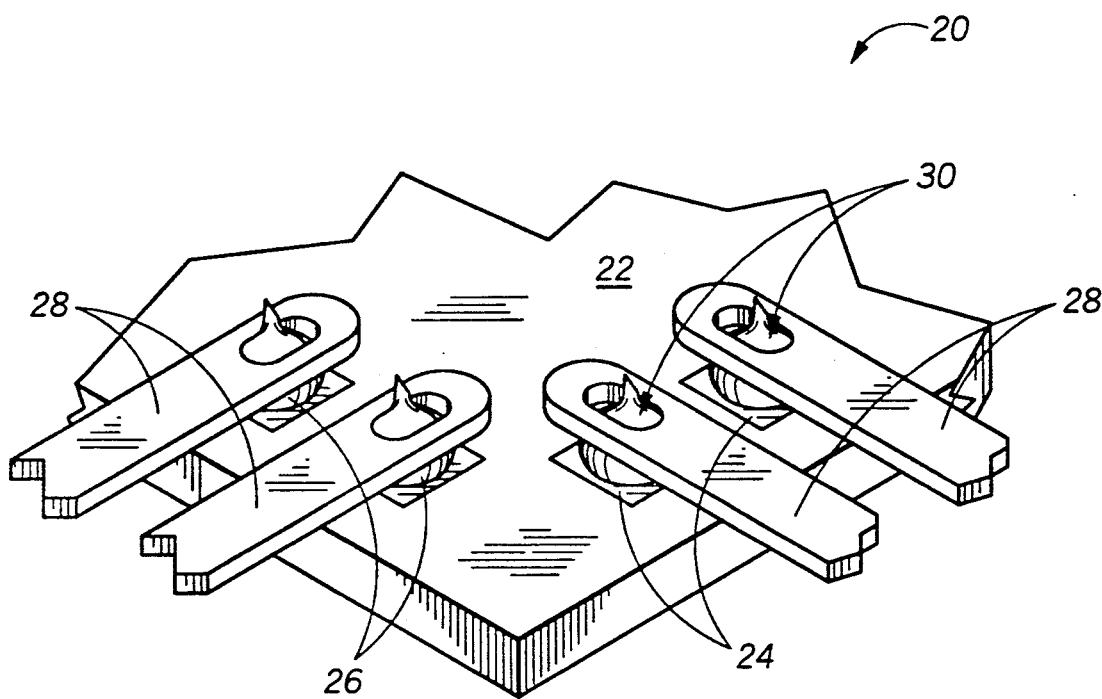
FIG. 3 is a perspective illustration of a portion of a semiconductor device which utilizes ball bumps in accordance with the present invention.

A semiconductor device 20 formed in accordance with the present invention is illustrated in a perspective view in FIG. 3. Semiconductor device 20 includes a semiconductor die 22 having a plurality of bonding pads 24 located on one of the die surfaces. Semiconductor die 22 may be an integrated circuit, for example a memory device, a microprocessor, an analog device, a gate array, or the like. A material which is commonly used as a bulk die material is silicon, although other materials are also suitable. Bonding pads 24 are of a conductive material, for example aluminum or an aluminum alloy. Formed on each of the bonding pads is one of ball bumps 26 which are most often made of gold or a gold alloy. As described earlier in the background section, ball bumps are formed on bonding pads by compressively bonding a fine gold or gold alloy wire to the pad and breaking the wire at a predetermined distance away from the bond. In conventional devices, ball bumps 26 have to be flattened or coined prior to lead bonding. However, the present invention eliminates the coining step by utilizing leads which accommodate the shape of the ball bumps. As FIG. 3 illustrates, a plurality of leads 28 are bonded to the ball bumps 26. Leads 28 are TAB leads which are typically a composite of various conductive and insulating layers which are laminated together. For example, leads 28 may include a polyimide film having copper or other conductive material laminated to major surfaces of the polyimide film. Lead bonding may be accomplished using any of the known bonding techniques including, but not limited to, thermosonic, thermo-compression, ultrasonic, laser, or reflow bonding techniques.

Figure 4:
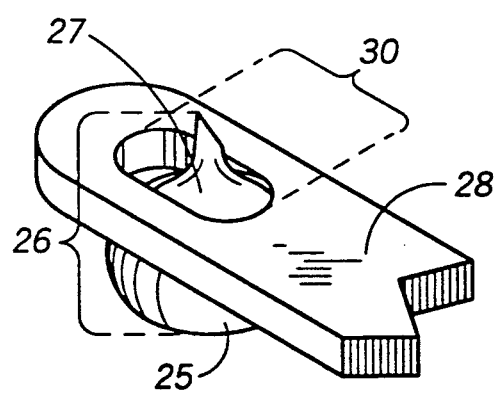
FIG. 4 is an enlarged perspective illustration of a lead and a ball bump of the semiconductor device of FIG. 3.

In accordance with one embodiment of the present invention, leads 28 each have a hole 30 which contains a portion of one of the ball bumps 26. FIG. 4 illustrates an enlarged view of one of the leads of the semiconductor device of FIG. 3. Lead 28 is bonded to bump 26 such that hole 30 contains a tail portion 27 of the bump. A base portion 25 of the bump is adjoined to tail portion 27 and is adjacent the bonding pad (not illustrated in FIG. 4, refer to FIG. 3). Since the hole is used to facilitate bonding, the hole is formed near the lead tip. As an example, hole 30 can be formed within 1 mm from the end of lead 28. However, the hole may be placed anywhere within the lead portion which overlies the semiconductor die. Hole 30 may be formed in lead 28 by selectively removing a desired portion of the lead, for instance by masking the lead and performing a chemical etch. Etching TAB leads is well understood by one of ordinary skill in the art, therefore the details of the etching process will not be addressed in the present discussion. The dimension of hole 30 may vary considerably. On one hand, the size of the hole should be as large as possible in order to ensure that the hole fits over the tail portion of the bump to align the lead. The larger hole 30 is made, the easier the lead alignment will be because tail portion 27 may be located anywhere within the hole and still result in lead alignment to the bump. As lead 28 is bonded to bump 26, the combination of hole 30 and tail portion 27 will guide the lead to the proper, centered location over bump 26. On the other hand, there is a physical limitation to the size of hole 30 which is determined by the width and thickness of lead 28. Naturally, a diameter of a hole formed in a lead cannot exceed the lead's width. In addition, the lead thickness will also affect hole size because the thicker the lead, the more difficult it is to control the etching process, particularly etch undercutting which will increase hole size. A reasonable guide to the dimensions of the hole is that the diameter of the hole be one to two times as large as the thickness of the lead. Another consideration in determining the size of a hole is the strength the lead will have with a hole formed therein. As the diameter of the hole increases, the mechanical strength of the lead will decrease. Substantial degradation in lead strength should be avoided for reasons related to reliability.

Figure 5:
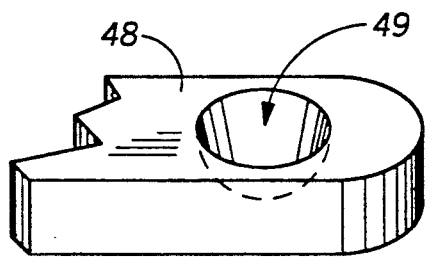
FIG. 5 is also an enlarged perspective illustration of a lead in accordance with the present invention.
Figure 6:
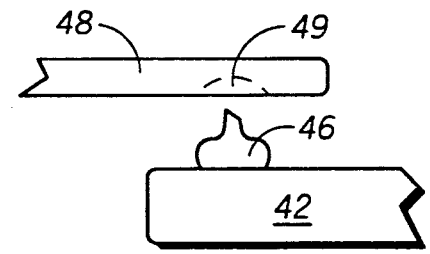
FIG. 6 is a cross-sectional illustration of the lead of FIG. 5 which represents the lead being bonded to a semiconductor device in accordance with the present invention.

While FIGS. 3 and 4 illustrate hole 30 as being an oval, this particular shape is not a requirement of the present invention. Holes formed within the TAB leads may be of any shape suitable for accommodating a portion of the bump, including square, rectangular, circular, or other regular or irregular geometric shape. Furthermore, another embodiment of the invention does not utilize TAB leads with holes but instead utilizes a TAB lead with dimples formed therein. FIG. 5 is a perspective illustration of a TAB lead 48 having a recessed area or a dimple 49. The dimple is used in place of hole 30 of the previous embodiment. Dimple 49 may also be formed using known TAB lead etching methods. The etch time is reduced in comparison to the previous embodiment in order to prevent the etch from penetrating completely through the lead. As FIG. 6 illustrates, lead 48 is placed above a bump 46 located on a semiconductor die 42 in preparation for bonding. The upper portion of the bump, referred to earlier as the tail portion, becomes contained within the dimple 49 as the bonding progresses. As in the previous embodiment, the combination of dimple 49 with the tail portion of bump 46 helps to align lead 48 properly with respect to the bump. It should be noted that a dimple or recession in the lead need not be semi-spherical as illustrated, but may be any shape that can accommodate a protruding portion of a bump.

Figure 7:
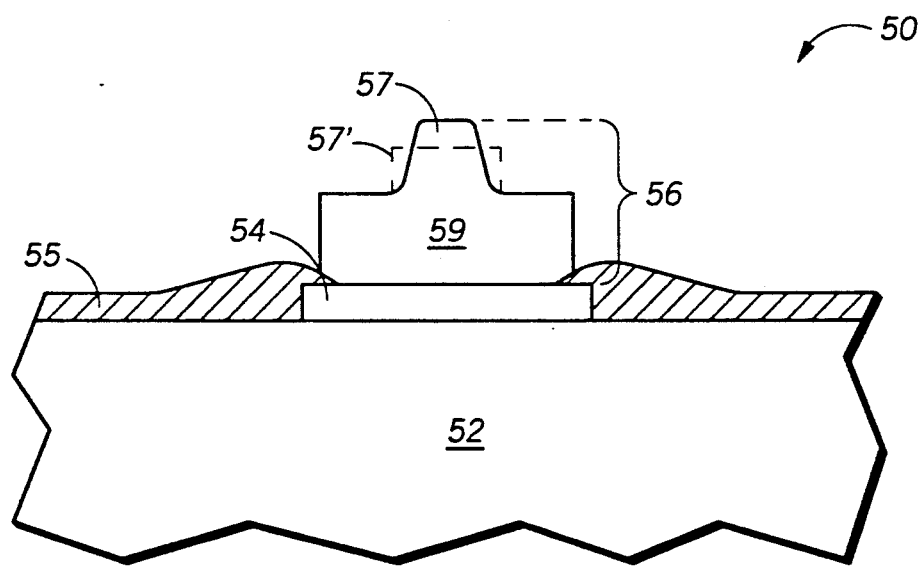
FIG. 7 is a cross-sectional illustration of another embodiment of the present invention in which a semiconductor device includes plated bumps.

The present invention may also be implemented on semiconductor devices having plated bumps as illustrated in FIG. 7. Although plating is usually more expensive and more time consuming than ball bumping, some semiconductor manufacturers may prefer plating for various reasons, for example a manufacturer may already have existing bump plating equipment. As in the use of ball bumps, employing plated bumps can lead to bond misalignment. By implementing the present invention, the potential for misalignment is reduced. A semiconductor device 50 is illustrated in cross-section in FIG. 7. The device includes a semiconductor die 52 similar to the die discussed in the previous embodiments. Located on semiconductor die 52 is a bonding pad 54. A passivation layer 55 is also illustrated. A passivation layer is commonly formed on a semiconductor die to protect the die from contamination. A plated bump 56 is formed on bonding pad 54 by, for example, electrodeposition plating. The plating process typical involves steps in addition to the actual plating deposition, such as sputter deposition, masking, and etching as discussed earlier. The process by which plated bump 56 is formed is not particularly relevant to the present invention and for this reason will not be described in detail. Plated bump 56 has two portions, a base portion 59 and a protruding portion 57. As in previous embodiments, protruding portion 57 is used to properly position a lead (not shown in FIG. 7) in relation to plated bump 56. Protruding portion 57 is illustrated as having sloped sides in order to make lead alignment easier; however, the protruding portion need not have sloped sides, as a dashed rectangular protrusion 57' demonstrates. Like the recessed portion or hole within a TAB lead, a protruding portion of a bump in accordance with the present invention is not limited to any particular shape.

As is evident from the foregoing discussion, the present invention provides for a semiconductor device having TAB leads, and a method for making the same, which has benefits over existing devices and processes. As an example, the present invention has a reduced cost over conventional ball bumping because the step of coining ball bumps may be eliminated. Further, the present invention reduces the probability of misaligned lead bonds because a recessed portion of a TAB lead in accordance with the invention helps to guide the lead into the appropriate position during lead bonding. The alignment aid of the present invention is not available with either existing ball bumping or plated bumping techniques used to bonding TAB leads.

Thus it is apparent that there has been provided, in accordance with the invention, a semiconductor device having tape automated bonding (TAB) leads which facilitate lead bonding and a method for making the same that fully meets the advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, bump material is not limited to gold but may be any conductive material used in the art to form bumps for TAB lead bonding. Likewise, the semiconductor device of the present invention is not limited to having one bump per semiconductor die bonding pad. As is commonly done in the industry, two or more bumps may be formed on an individual bonding pad. As addressed earlier, the present invention is not limited by the shape of a bump, a lead, or a recessed portion of the lead. Nor are the leads limited in any way to the copper laminated polyimide film described, but instead may be any form of lead used in tape automated bonding. It is also important to note that the present invention is not limited in any way to specific bump formation or bonding techniques. Any bumping techniques or lead bonding techniques known in the art may be used in accordance with the present invention. Furthermore, this invention is not limited to those types of semiconductor die described or illustrated herein. Therefore, it is intended that this invention encompass all such variations and modifications as fall within the scope of the appended claims.

I claim:

1. A semiconductor device having tape automated bonding (TAB) leads which facilitate lead bonding, comprising:
   a semiconductor die having a plurality of bonding pads thereon;
   a plurality of ball bumps formed from a conductive wire, each bump having a base portion and a protruding portion, the base portion of each bump being formed on one of the plurality of bonding pads; and
   a plurality of leads, each lead being bonded to a respective one of the plurality of bumps and having a recessed portion which accommodates the protruding portion of the respective one of the plurality of bumps in order to facilitate lead bonding, the recessed portion having a width and a length, wherein both the width and the length of the recessed portion are larger than the protruding portion of the respective bump and smaller than the base portion of the respective bump.

2. The semiconductor device of claim 1 wherein the recessed portion of the lead comprises a hole which extends from a first surface of the lead through to a second surface of the lead, the second surface being opposite the first surface.

3. The semiconductor device of claim 1 wherein the recessed portion of the lead comprises a dimple formed in a first surface of the lead.

4. The semiconductor device of claim 1 wherein the bumps are comprised of gold.

5. A semiconductor device having tape automated bonding (TAB) leads which facilitate lead bonding, comprising:
   a semiconductor die having a plurality of bonding pads thereon;
   a bump located on and electrically coupled to each of the plurality of bonding pads, the bump being formed from a conductive wire and having a base portion which is adjacent the bonding pad and a protruding portion adjoining the base portion; and
   a plurality of leads electrically coupled to the plurality of bonding pads, each lead having an opening which contains the protruding portion of one of the bumps, the opening having a width and a length, wherein both the width and the length of the opening are larger than the protruding portion of the respective bump and smaller than the base portion of the respective bump.

6. The semiconductor device of claim 5 wherein the bumps are comprised of gold.

7. The semiconductor device of claim 5 wherein the opening of the lead comprises a hole which extends from a first surface of the lead through to a second surface of the lead, the second surface being opposite the first surface.

8. The semiconductor device of claim 5 wherein the opening of the lead comprises a dimple formed in a first surface of the lead.

* * * * *